(12) United States Patent  
Oshima (10) Patent No.: US 7,871,231 B2
(45) Date of Patent: Jan. 18, 2011

(54) VERTICAL CARRYING APPARATUS

(75) Inventor: Munekuni Oshima, Ise (JP)

(73) Assignee: Muratec Automation Co., Ltd., Kyoto-shi, Kyoto (JP)

( * ) Notice: Subject to any disclaimer, the term of this patent is extended or adjusted under 35 U.S.C. 154(b) by 396 days.

(21) Appl. No.: 12/097,428

(22) PCT Filed: Dec. 14, 2006

(86) PCT No.: PCT/JP2006/324978

§ 371 (c)(1),
(2), (4) Date: Jun. 13, 2008

(87) PCT Pub. No.: WO2007/069701

PCT Pub. Date: Jun. 21, 2007

(65) Prior Publication Data

US 2009/0288931 A1    Nov. 26, 2009

(30) Foreign Application Priority Data

Dec. 16, 2005    (JP)    ............................... 2005-362757

(51) Int. Cl.
*B65G 65/00*    (2006.01)

(52) U.S. Cl. ...................... 414/272; 414/278; 414/282; 198/349.1

(58) Field of Classification Search .............. 414/272, 414/278, 282; 198/349.1, 349.4, 349.5, 369.6, 198/358; 187/203, 210, 213

See application file for complete search history.

(56) References Cited

U.S. PATENT DOCUMENTS

| 3,075,655 | A | * | 1/1963 | Bryant | 414/264 |
| 3,792,785 | A | * | 2/1974 | Weir | 414/278 |
| 3,968,888 | A | * | 7/1976 | Van Vliet | 414/273 |
| 4,484,289 | A | * | 11/1984 | Hemond | 700/113 |
| 4,768,914 | A | * | 9/1988 | Sing | 414/237 |
| 4,946,006 | A | * | 8/1990 | Kume | 187/249 |
| 5,044,859 | A | * | 9/1991 | Sorensen et al. | 414/273 |
| 5,235,144 | A | * | 8/1993 | Matsui et al. | 187/250 |
| 5,441,141 | A | * | 8/1995 | Bonnet | 198/370.03 |
| 5,467,561 | A | * | 11/1995 | Takaoka | 52/30 |
| 6,077,017 | A | * | 6/2000 | Durant | 414/254 |
| 6,516,239 | B1 | * | 2/2003 | Madden et al. | 700/115 |

(Continued)

FOREIGN PATENT DOCUMENTS

JP    63-37023    2/1988

(Continued)

*Primary Examiner*—Joe Dillon, Jr.
(74) *Attorney, Agent, or Firm*—Drinker Biddle & Reath LLP (57) ABSTRACT

An elevation conveyor 5 includes a turntable 17 and a roller conveyor 18. The roller conveyor 18 is supported onto the turntable 17. A turntable controller 7 turns the turntable 17 so that the roller conveyor 18 matches with a carrying direction of a conveyor rail for receiving or delivering a load and then drives the conveyor rail and the roller conveyor 18 to receive or deliver an FOUP 8. An elevation conveyor 5 is held in a cable 20*a* installed in an elevation space 9 through a coupling member 20*b* of a cableveyor 20, and can freely elevate and stop at a port 21 installed on each floor while being interlocked with motion of the cableveyor 20 caused by reciprocating circulation of the cableveyor 20 in a vertical direction by an elevation conveyor controller 4.

4 Claims, 6 Drawing Sheets

U.S. PATENT DOCUMENTS

| | | | |
|---|---|---|---|
| 6,799,671 B1 * | 10/2004 | Sanchez Gomez | 198/349.5 |
| 6,854,583 B1 * | 2/2005 | Horn | 198/348 |
| 6,971,500 B2 * | 12/2005 | Horn | 198/348 |
| 7,191,874 B2 * | 3/2007 | Tai et al. | 187/244 |
| 7,591,630 B2 * | 9/2009 | Lert, Jr. | 414/807 |
| 2008/0034674 A1 * | 2/2008 | Abe | 52/30 |

FOREIGN PATENT DOCUMENTS

| | | |
|---|---|---|
| JP | 5-262407 | 10/1993 |
| JP | 6-239416 | 8/1994 |
| JP | 9-142644 | 6/1997 |
| JP | 2001-187631 | 7/2001 |
| JP | 2002-167032 | 6/2002 |

* cited by examiner

VERTICAL CARRYING APPARATUS

TECHNICAL FIELD

The present invention relates to a vertical carrying apparatus which is connected to a plurality of carrying paths provided on a plurality of floors so as to carry an object to be carried in a vertical direction.

BACKGROUND ART

In production plants such as a semiconductor production plant and an LCD panel production plant, a carrier having an article (for instance, in case of the semiconductor production plant, objects such as a semiconductor substrate, an LCD glass substrate, a photomask glass substrate, and an optical disk substrate) received therein is carried by a carrying system using a carrying conveyor, an OHT, an OHS, and the like in accordance with the processes. In the production plants using the carrying system, in many cases, a plurality of floors are provided with production processes due to an increase in the number of production units and a size of a carrying system in accordance with an increase in a production scale and a size of the production plant. In such a case, a carrying operation is performed between the floors in a vertical direction and on the same floor in a horizontal direction.

Here, in the carrying system in which a load is carried between the floors in terms of a conveyor carrying type, as a known technique for performing the carrying operation in the vertical direction, for instance, Patent Documents 1 and 2 disclose a vertical carrying apparatus such as a lifter having a conveyor function. Patent Document 1 discloses a lifter having a conveyor function, and the lifter conveyor is installed at a load delivering position adjacent to a horizontal portion of a solid loop carrying apparatus provided on the first floor and the second floor so as to perform a roller carrying operation while elevating between the first floor and the second floor. In addition, Patent Document 2 discloses a loading and unloading chain conveyor with a lifter having a function similar to that of Patent Document 1.

In addition, in a carrying system in which a load is carried between floors in terms of a carrying type other than the conveyor carrying type, as a known technique for performing the carrying operation in the vertical direction, there are known a vertical carrying apparatus such as a pantograph-type elevation apparatus and an elevator mounted with a stacker crane and a transfer unit.

Patent Document 1: Japanese Patent Publication No. 6-239416A
Patent Document 2: Japanese Patent Publication No. 5-262407A

DISCLOSURE OF THE INVENTION

Problems to be Solved by the Invention

Here, in recent years, it has been demanded to improve efficiency of the carrying operation for instance, reduction in carrying time) in the carrying system in accordance with strong request for production efficiency. Particularly, in the conveyor carrying-type carrying system which can attain high production efficiency due to high carrying performance, in order to harmonize the carrying performance with the vertical carrying apparatus which carries a load between floors, it is important to efficiently perform the carrying operation between floors. However, in the lifter having the conveyor function disclosed as an example in Patent Documents 1 and 2 described above, in any case a carrying direction of the conveyor mounted to the lifter is fixed all the time and a carrying direction of a conveyor provided on a floor for receiving a load and a carrying direction of a conveyor provided on a floor for delivering the load are fixed so as to be identical with each other all the time. As a result, a problem arises in that it is not possible to build a carrying conveyor path without regulating the carrying direction under the unified specification in consideration of the carrying direction of the conveyor. That is, a problem arises in that the lifter related to the prior art cannot be applied to the conveyor carrying-type carrying system with carrying conveyor paths of various directions, and cannot handle a change of the carrying direction of the carrying conveyor path in accordance with an increase in a size of a carrying system. In addition, although it is possible to handle the conveyor carrying-type carrying system in which a plurality of floors are provided with carrying conveyors of various carrying directions in terms of a combination of a transfer unit (transfer robot and the like) for transferring a load onto the vertical carrying apparatus, since carrying performance of the transfer unit is low, the transfer unit cannot be harmonized with the conveyor carrying type having high carrying performance, and thus a problem arises in that the carrying system is not efficient.

In addition, in the vertical carrying apparatus used in the carrying system which carries a load between floors in terms of a carrying type other than the conveyor carrying type, for instance, the pantograph-type elevation apparatus has a limitation in elevation height, and thus a problem arises in that it is not possible to handle a carrying system provided with a plurality of floors. In addition, although the stacker crane is a carrying apparatus which can be freely elevated without a limitation in height, it is necessary to use the transfer unit such as the transfer robot upon transferring a load, and thus a problem arises in that time for transferring the transfer unit results in deterioration in efficiency of the carrying operation between floors. In the vertical carrying apparatus related to the prior art, since the transfer unit is used in the elevator mounted with the transfer unit, it takes time for transferring a load, and thus it is not possible to obtain efficiency of the carrying operation between floors.

Therefore, an objection of the invention is to provide a vertical carrying apparatus capable of improving efficiency of a carrying operation between floors in a carrying system in which a plurality of floors are provided with carrying paths of various carrying directions.

Means for Solving the Problem

According to Aspect 1 of the invention, there is provided a vertical carrying apparatus which is connected to a plurality of carrying paths provided on a plurality of floors so as to vertically carry an object to be carried, the vertical carrying apparatus including: a carrying direction setting unit including a carrying conveyor which places the object carried from one of the carrying paths thereon and carries the object to one of the carrying paths and a rotation unit which turns the carrying conveyor to match with the carrying direction of the carrying path; an elevator unit which vertically elevates the carrying direction setting unit between the plurality of carrying paths provided on the plurality of floors; and a vertical carrying control unit which controls the carrying direction setting unit and the elevator unit on the basis of a carrying operation instruction of the object.

In the vertical carrying apparatus according to Aspect 2, upon receiving the object, the vertical carrying control unit may control the elevator unit so that the carrying direction setting unit is elevated up to a floor provided with a carrying conveyor for receiving the object and controls the rotation unit so that the carrying conveyor matches with the carrying direction of the carrying conveyor for receiving the object; and upon delivering the object, the vertical carrying control unit may control the elevator unit so that the carrying direction setting unit is elevated up to a floor provided with a carrying conveyor for delivering the object and controls the rotation unit so that the carrying conveyor matches with the carrying direction of the carrying conveyor for delivering the object.

In the vertical carrying apparatus according to Aspect 3, the elevator unit may include an elevation path which is vertically installed along the plurality of floors provided with the carrying paths and a hold member which holds the carrying direction setting unit in the elevation path; and one of the elevation path and the hold member may be driven so as to elevate the carrying direction setting unit.

In the vertical carrying apparatus according to Aspect 4, the carrying paths may be provided in a production plant having a plurality of floors, and the carrying paths and the carrying conveyor may be configured as a roller conveyor.

Advantage of the Invention

According to Aspect 1 of the invention, when a high-rank carrying system outputs the carrying operation instruction of an object to be carried, the rotation unit can allow the carrying conveyor to match with the carrying direction of the carrying path for receiving or delivering the object, and the elevator unit can elevate the carrying direction setting unit from a floor provided with the carrying path for receiving the object to a floor provided with the carrying path for delivering the object. Accordingly, it is possible to improve efficiency of a carrying operation between floors in a carrying system in which a plurality of floors are provided with carrying paths of various carrying directions.

According to Aspect 2 of the invention, when the high-rank carrying system outputs the carrying operation instruction of the object to be carried, the vertical carrying control unit can automatically control the rotation unit so that the carrying conveyor matches with the carrying direction of the conveyor rail for receiving or delivering the object and can control the elevator unit so that the carrying direction setting unit is elevated from the floor provided with the conveyor rail for receiving the object to the floor provided with the conveyor rail for delivering the object.

Accordingly, it is possible to further improve efficiency of a carrying operation between floors in a carrying system in which a plurality of floors are provided with carrying paths of various carrying directions.

According to Aspect 3 of the invention, the elevator unit can be realized with a simple configuration. Accordingly, it is possible to realize a vertical carrying operation between floors, that is, a vertical carrying operation between a plurality of floors in an easy manner in a conveyor carrying-type carrying system in which a plurality of floors are provided with carrying conveyors of various carrying directions.

According to Aspect 4 of the invention, particularly, in a production plant using a carrying system in which a plurality of floors are provided with production processes due to an increase in the number of production units and a size of a carrying system in accordance with an increase in a production scale and a size of the production plant, when the vertical carrying apparatus is applied to a roller conveyor carrying-type carrying system in which loads needs to be efficiently carried between floors by a roller conveyor, it is possible to improve efficiency of a carrying operation between floors.

In addition, in the invention, the carrying path includes a carrying path of a carrying system using a carrying type such as an OHS or an OHT as well as a carrying conveyor path of a carrying system using a conveyor carrying type. Further, the carrying conveyor includes a belt conveyor and the like in addition to the roller conveyor and the chain conveyor.

DESCRIPTION OF REFERENCE NUMERALS AND SIGNS

1: VERTICAL CARRYING APPARATUS
3: VERTICAL CARRYING CONTROLLER (VERTICAL CARRYING CONTROL UNIT)
4: ELEVATION CONTROLLER
5: ELEVATION CONVEYOR (CARRYING DIRECTION SETTING UNIT)
7: TURNTABLE CONTROLLER
8: FOUP (OBJECT TO BE CARRIED)
10-1 to 10-3: CONVEYOR RAIL (CARRYING PATH)
11-1 to 11-3: CONVEYOR RAIL (CARRYING PATH)
12-1 to 12-2: CONVEYOR RAIL (CARRYING PATH)
13: CONVEYOR RAIL (CARRYING PATH)
17: TURNTABLE (ROTATION UNIT)
18: ROLLER CONVEYOR (CARRYING CONVEYOR)
20: CABLEVEYOR (ELEVATOR UNIT)
20$a$: CABLE (ELEVATION PATH)
20$b$: COUPLING MEMBER (HOLD MEMBER)

BEST MODE FOR CARRYING OUT THE INVENTION

Hereinafter, a vertical carrying apparatus according to an exemplary embodiment of the invention will be described with reference to the accompanying drawings. Additionally, this embodiment describes a case where a carrying system in which a plurality of floors are provided with roller conveyors is used in a semiconductor production plant in which production processes are provide on a plurality of floors.

Figure 1:
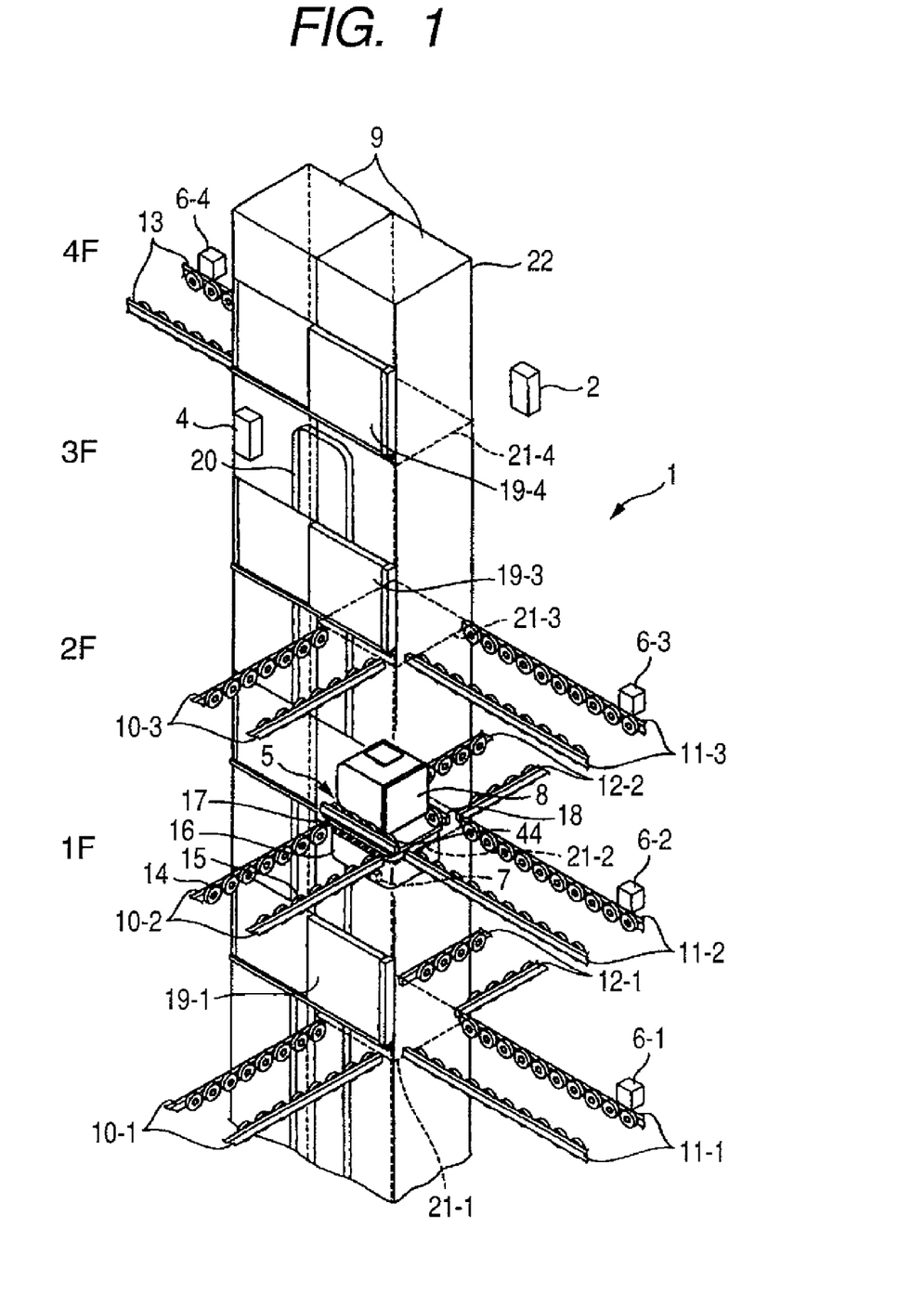
FIG. 1 is a perspective view illustrating a vertical carrying apparatus according to an embodiment.

The vertical carrying apparatus according to this embodiment will be described hereinafter with reference to FIG. 1. FIG. 1 is a perspective view illustrating the vertical carrying apparatus according to this embodiment.

Figure 2:
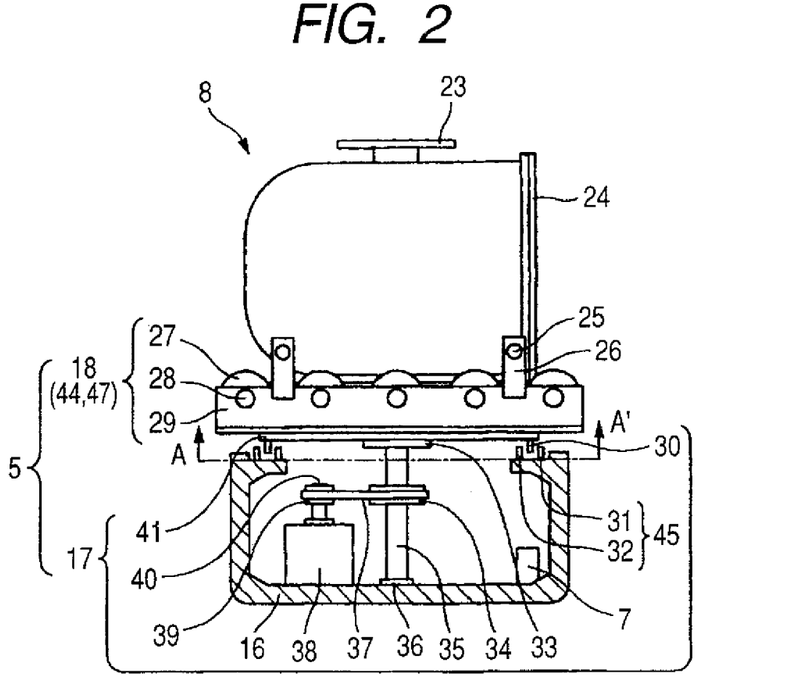
FIG. 2 is a front view which partly includes a sectional view and illustrates a turntable of the vertical carrying apparatus mounted with an FOUP according to the embodiment.

As shown in FIG. 1, a vertical carrying apparatus 1 includes an elevation conveyor (carrying direction setting unit) 5, a cableveyor (elevator unit) 20, and a vertical carrying controller (vertical carrying control unit) 3 with an elevation controller 4 and a turntable controller 7 (see FIG. 2). In addition, a system controller 2 shown in FIG. 1 is a controller for controlling a whole carrying system and outputs a carrying operation instruction of an FOUP 8 which corresponds to an object to be carried.

The elevation conveyor 5 is installed at an elevation space 9 which is formed through four floors and is defined by an outer wall 22. Then, ports 21-1 to 21-4 are installed for respective floors of the elevation space 9, and the ports 21-1 to 21-4 for the respective floors are connected to one or more conveyor rails (carrying path). In the example shown in FIG. 1, on the first floor, three conveyor rails (a conveyor rail 10-1, a conveyor rail 11-1, and a conveyor rail 12-1) are connected to the port 21-1. On the second floor, three conveyor rails (a conveyor rail 10-2, conveyor rail 11-2, and a conveyor rail 12-2) are connected to the port 21-2. On the third floor, two conveyor rails (a conveyor rail 10-3 and a conveyor rail 11-3) are connected to the port 21-3. In addition, on the fourth floor, one conveyor rail (a conveyor rail 13) is connected to the port 21-4. Further, conveyor rails from the first to fourth floor are respectively provided with conveyor rail controllers 6-1, 6-2, 6-3, and 6-4 corresponding to the conveyor rails provided on the floors.

Figure 8:
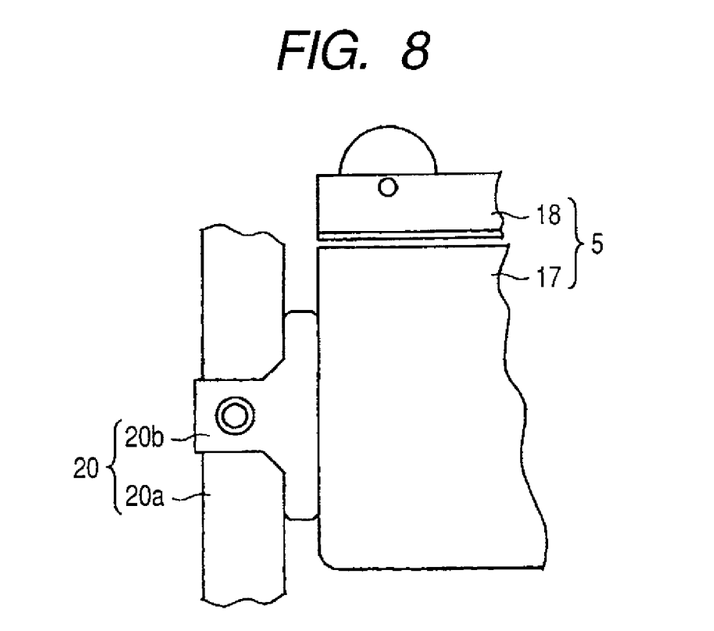
FIG. 8 is a front view which partly includes a sectional view and illustrates a cableveyor of the vertical carrying apparatus according to the embodiment.

Here, the cableveyor 20 according to the embodiment will be described in detail with reference to FIG. 8. FIG. 8 is a front view which partly includes a sectional view and illustrates a cableveyor of the vertical carrying apparatus according to the embodiment. The cableveyor 20 includes a cable (elevation path) 20a and a coupling member (hold member) 20b. Then, the elevation conveyor 5 is held in the cable 20a installed in the elevation space 9 by, for instance, the coupling member 20b shown in FIG. 8, and can freely elevate and stop at the port 21 provided on the first to fourth floor while being interlocked with motion of the cableveyor 20 (i.e., the cable 20a) caused by reciprocating circulation of the cableveyor 20 (i.e., the cable 20a) in the vertical direction under the control of the elevation conveyor controller 4.

Figure 3:
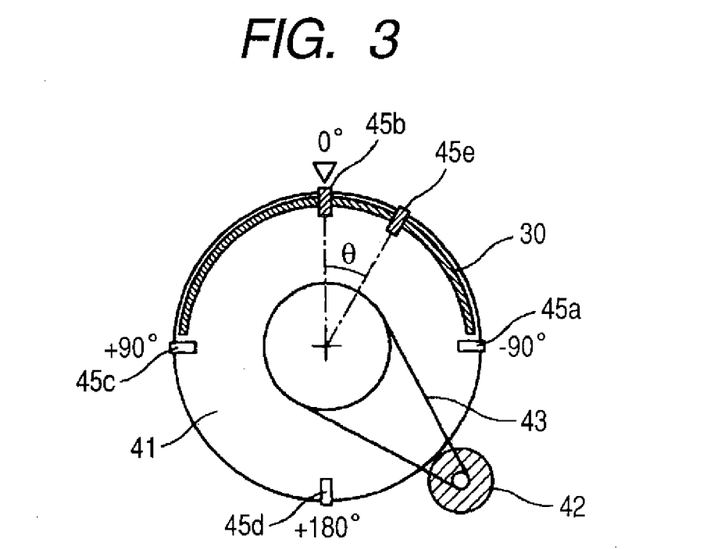
FIG. 3 is a sectional view illustrating a drive principle of a turn position determination of the turntable of the vertical carrying apparatus according to the embodiment when taken along the line A-A'.
Figure 4:
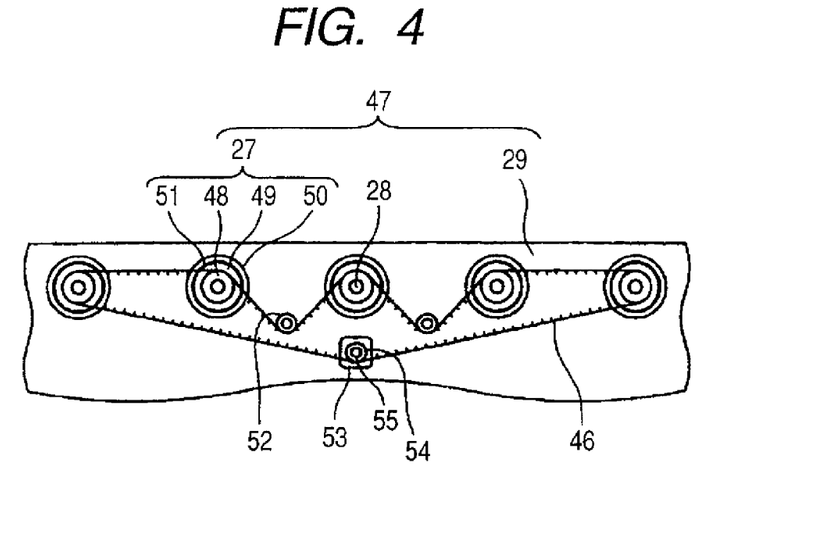
FIG. 4 is a front view illustrating a drive principle of a roller conveyor of the vertical carrying apparatus according to the embodiment.

Here, the elevation conveyor 5 according to this embodiment will be described in detail with reference to FIGS. 2 to 4. FIG. 2 is a front view which partly includes a sectional view and illustrates a turntable of the vertical carrying apparatus mounted with an FOUP according to the embodiment. FIG. 3 is a sectional view illustrating a drive principle of a turn position determination of the turntable of the vertical carrying apparatus according to the embodiment when taken along the line A-A'. FIG. 4 is a front view illustrating a drive principle of a roller conveyor of the vertical carrying apparatus according to the embodiment.

As shown in FIG. 2, the elevation conveyor 5 includes a turn table (rotation unit) 17 and a roller conveyor (carrying conveyor) 18. Here, the roller conveyor 18 is supported by a table 41 constituting the turntable 17. Then, the table 41 is supported to a turning shaft 35 through a support member 33, and the turning shaft 35 is fixed to the lifter frame 16 through a bearing 36. In addition, a pulley 34 is axially supported to the turning shaft 35, and is connected to a pulley 39 which is axially supported to a rotation shaft 40 of a driving motor 38 through a timing belt 37 so as to rotate in a positive direction upon driving the driving motor 38. Then, a turntable controller 7 is installed in a lifer frame 16, and drives the driving motor 38 to turn the table 41 on the basis of a rotation direction of a table 41 detected by a dog 30 and a photo sensor 45 described below and a carrying operation instruction from a system controller 2 described below. In addition, the carrying conveyor provided in the elevation conveyor 5 is not limited to the roller conveyor 18, but may be configured as a chain conveyor, a belt conveyor, or the like.

Here, a turn position determining mechanism of the turntable 17 constituting the elevation conveyor 5 and a drive principle thereof will be described with reference to FIGS. 2 and 3. As shown in FIG. 2, the photo sensor 45 having a pair of light-receiving element 31 and light-emitting element 32 is installed in the upper end surface of the lifter frame 16 with the dog 30 installed in the lower surface of the table 41 interposed therebetween. The photo sensor 45 and the dog 30 are installed in the apparatus to determine a carrying direction of the roller conveyor by detecting a rotation direction of the turntable 17, that is, the table 41. As shown in FIG. 3, a turn position determining mechanism of the turntable 17 includes four dog detecting sensors 45a, 45b, 45c, 45d, an auxiliary dog detecting sensor 45e, and the dog 30. The dog 30 is rotation position recognition means of the table 41, and is a flat plate installed on the table 41 so as to be curved along the outer circumference of the table 41. In addition, the dog 30 has a length to cover a range slightly shorter than a half circumference of the table 41. Four dog detecting sensors 45a, 45b, 45c, and 45d are installed in the circle edge of the upper surface of the lifter frame 16 with the dog 30 interposed between the light-emitting element 31 and the light-receiving element 32 so as to be disposed on the extension lines of the parting lines quadrisecting a central angle about a rotation shaft 52. In addition, the auxiliary dog detecting sensor 45e is fixed to the circle edge of the upper surface of the lifter frame 16 so as to be away from the dog detecting sensor 45b by the central angle θ in the clockwise direction. Here, the dog detecting sensor 45a is referred to as a −90 degree position sensor, the dog detecting sensor 45b is referred to as a 0 degree position sensor, the dog detecting sensor 45c is referred to as a +90 degree position sensor, the dog detecting sensor 45d is referred to as a +180 degree position sensor, and the dog detecting sensor 45e is referred to as an over position determining sensor. The auxiliary dog detecting sensor 45e is installed to determine a position over by +180 degree and a position over by −90 degree. The rotation position of the table 41 is determined by the central position of the dog 30. For instance, in FIG. 3, it is assumed that the center of the dog 30 is located at the 0 degree position and the table 41 is located at the 0 degree position. In addition, the stop position of the table 41 is limited to four positions where the center position of the dog 30 is located at 0 degree, +90 degree, +180 degree, and −90 degree. In this way, the rotation position of the table 41 can be recognized by a combination of whether the dog 30 is detected by five photo sensors 45 including the dog detecting sensors 45a, 45b, 45c, 45d, and the auxiliary dog detecting sensor 45e. In addition, the rotation of the table 41 includes two directions of a clockwise direction and a counterclockwise direction. The starting point of the rotation is set to 0 degree. Accordingly, the table 41 is rotated in the clockwise direction when the position needs to be located at −90 degree and is rotated in the counterclockwise direction when the position needs to be located at +90 degree and +180 degree. Then, the driving motor 38 is driven to turn the table 41 by the turn instruction output from the turntable controller 7 on the basis of the carrying operation instruction output from the system controller 2 and the rotation position of the table 41 detected by the photo sensor 45 and the dog 30. In addition, the turn position determining mechanism of the turntable 17 determines the carrying direction of the roller conveyor and detects the position of the table upon turning on the apparatus. The turn position determining mechanism of the turntable 17 is not limited to the configuration described above, but may be configured as a mechanism for rotating the turntable 17 in a predetermined direction on the basis of the rotation position of the turntable 17.

Next, the roller conveyor 18 constituting the elevation conveyor 5 will be described with reference to FIGS. 2 and 4. The roller conveyor 18 is supported onto the turntable 17, and includes a roller support frame 29, a roller 27, and a roller shaft 28. Then, the roller 27 is disposed on both sides of the frame 29, and includes a driving roller 47 with a driving mechanism which is disposed on one side and a driven roller 44 without the driving mechanism which is disposed on the other side so as to be rotatable. The driving roller 47, as shown in FIG. 4, includes one block of five rollers 27. Then, the driving roller 47 is supported to the roller support frame 29 of the roller conveyor 18 so that the roller shaft 28 is rotatable. A load receiving portion 49 and a guard portion 50 are incorporated into the roller shaft 28, and urethane rubber 51 is inserted to the outer circumference of the load receiving portion 49. In addition, a gear pulley 48 is inserted to the roller shaft 28, a sprocket 54 is fixed to a driving shaft 55 of a driving motor 53, and then the sprocket 54 is disposed on the same vertical plane together with the sprocket 48 fixed to the series of rollers 27. A timing belt 46 forms one loop by sequentially engaging with gear surfaces (inner circumferential surfaces) of the sprocket 54 of the driving motor 53 as a driving source of the roller 27 and the plurality of sprockets 48 (five units in the example shown in FIG. 4) provided in the series of rollers 27 arranged in a linear shape. Then, tension rollers 52 are disposed at appropriate positions (two positions in the example shown in FIG. 4) on the side of the timing belt 46 without the gear portions. In addition, support shafts of the tension rollers 52 apply tension to the timing belt 46. The guard portion 50 has a function of compulsorily regulating horizontal motion of the FOUP 8 carried on the roller conveyor 18 so as not to be separated from the conveyor path.

In addition, a pair of sensor support members 26 is attached to the roller support frame 29 of the roller conveyor 18, and a load detecting sensor 25 is installed onto the pair of sensor support members 26. The pair of load detecting sensors 25 determines whether the FOUP 8 exists or not and whether the FOUP 8 is mounted at a normal position. It is determined that the FOUP 8 is mounted to the normal position when both the pair of load detecting sensors 25 detects the FOUP. It is determined that the FOUP 8 is not mounted to the normal position when one of the pair of load detecting sensors 25 detects the FOUP. It is determined that the FOUP 8 does not exist when both the pair of load detecting sensors 25 does not detect the FOUP. In addition, the determination whether the FOUP 8 exists or not and the FOUP 8 is mounted to the normal position or not by the load detecting sensors 25 is output to the turntable controller 7.

Figure 5:
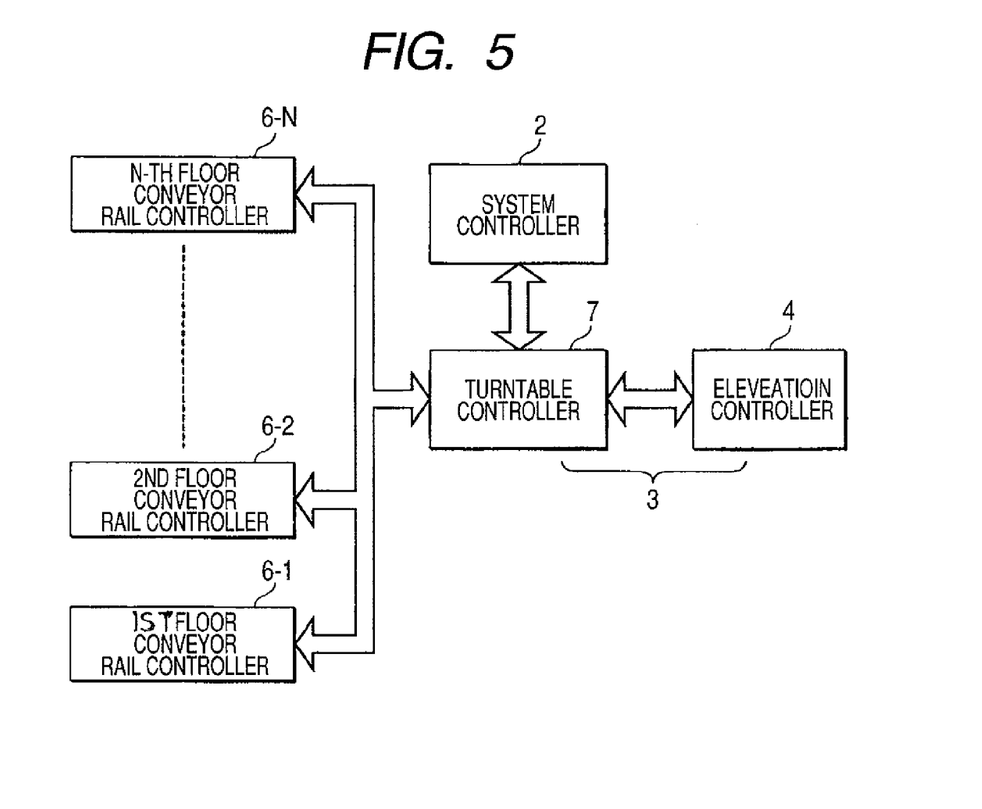
FIG. 5 is a block diagram illustrating a vertical carrying controller of the vertical carrying apparatus according to the embodiment.

Next, an operation of the vertical carrying controller 3 for controlling the elevation conveyor 5 and the cableveyor 20 will be described with reference to FIG. 5. FIG. 5 is a block diagram illustrating a vertical carrying controller of the vertical carrying apparatus according to the embodiment. As shown in FIG. 5, the vertical carrying controller 3 includes the turntable controller 7 for controlling the elevation conveyor 5 and the elevation controller 4 for controlling the cableveyor 20.

The turntable controller 7 is connected to the system controller 2, the elevation controller 4, and the conveyor rail controller 6 (1 to N-th floor conveyor rail controllers 6-1 to 6-N), and transmits and receives a signal to and from the respective controllers connected to the turntable controller 7. In addition, the turntable controller 7 stores data attached to the FOUP 8 (specific carrying direction data of the turntable 17 on each floor and movement floor data of the elevation controller 4). Then, the turntable controller 7 determines whether a current floor is a target floor (a floor to be provided with the conveyor rail for receiving the load or a floor to be provided with the conveyor rail for delivering the load) upon receiving a carrying operation request output from the system controller 2, and transmits an elevation instruction to the elevation controller 4 when the current floor is different from the target floor. At the same time, the turntable controller 7 turns the turntable 17 to match with the carrying direction of the target conveyor rail (a conveyor rail for receiving the load or a conveyor rail for delivering the load). In addition, after the elevation conveyor arrives at the target floor (a floor to be provided with the conveyor rail for receiving the load or a floor to be provided with the conveyor rail for delivering the load), the turntable controller 7 connects the paths of the roller conveyor 18 of the elevation conveyor 5 to the conveyor rail for receiving or delivering the load. In this state, the turntable controller transmits a drive instruction of the roller of the conveyor rail to the conveyor rail controller 6 on the current floor and drives the driving roller 47 of the elevation conveyor 5.

The elevation controller 4 reciprocates the cableveyor 20 in the vertical direction upon receiving the elevation instruction output from the turntable controller 7 so as to elevate the elevation conveyor 5 up to the target floor (a floor to be provided with the conveyor rail for receiving the load or a floor to be provided with the conveyor rail for delivering the load). Then, the elevation controller transmits an elevation end signal to the turntable controller 7 when it is checked that the elevation conveyor arrives at the port on the target floor (a floor to be provided with the conveyor rail for receiving the load or a floor to be provided with the conveyor rail for delivering the load).

Figure 6:
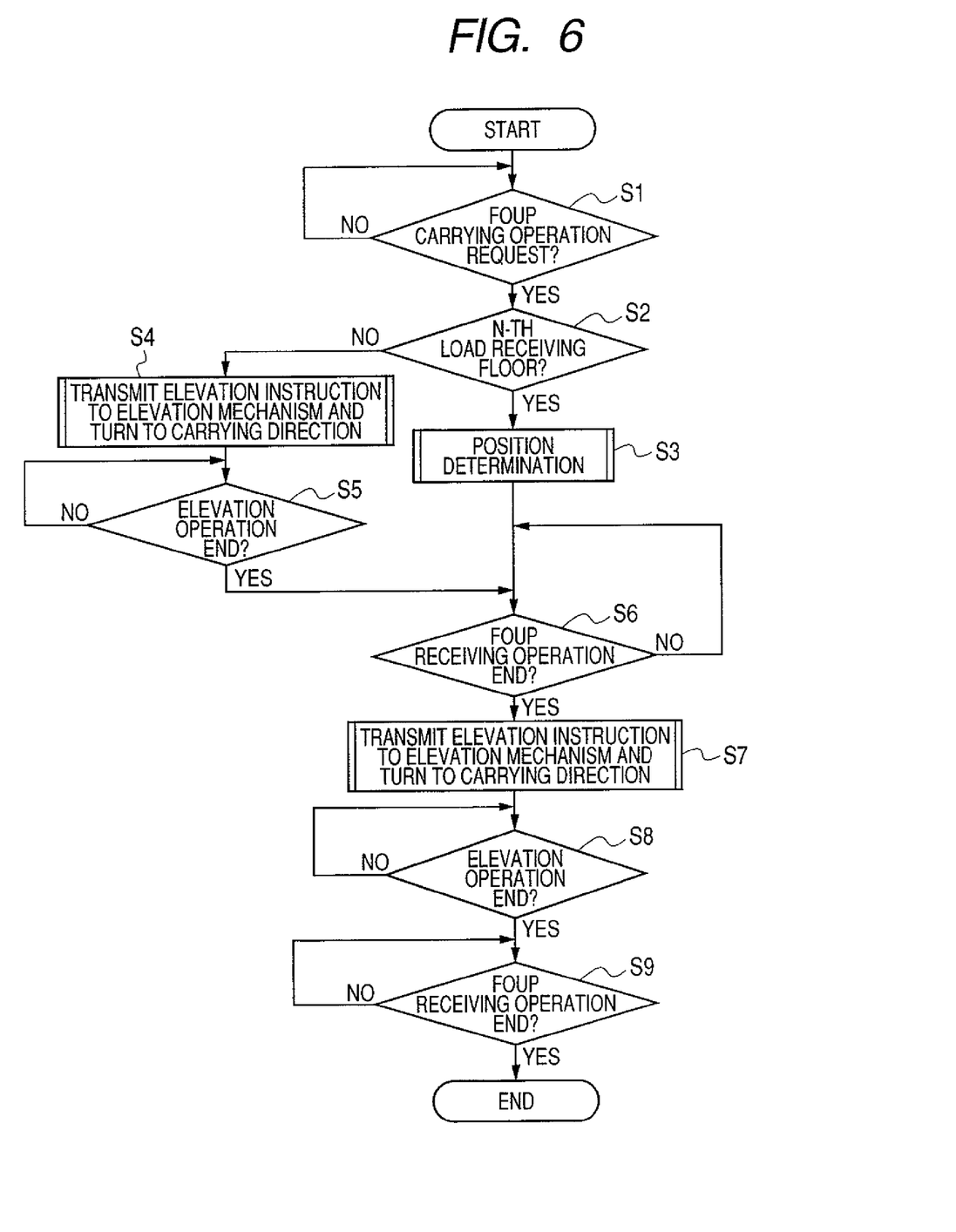
FIG. 6 is a flowchart illustrating a procedure of a turntable controller of the vertical carrying controller according to the embodiment.
Figure 7:
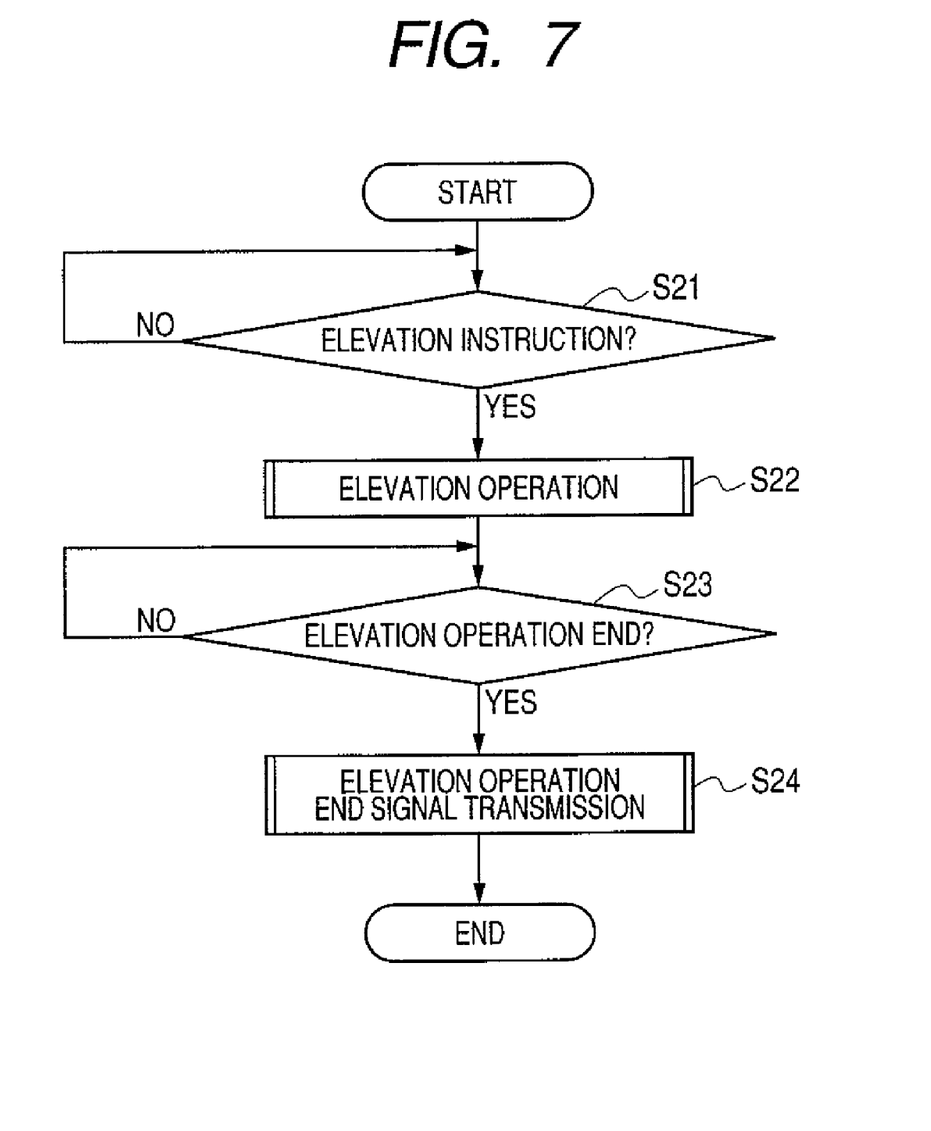
FIG. 7 is a flowchart illustrating a procedure of an elevation controller of the vertical carrying controller according the embodiment.

Here, a process procedure in which the vertical carrying controller 3 performs a load receiving operation on a certain floor and a load delivering operation on a certain floor after elevating up to a certain floor upon receiving the carrying operation request output from the system controller 2 will be described with reference to FIGS. 6 and 7. FIG. 6 is a flowchart illustrating a process procedure of the turntable controller 7 of the vertical carrying controller 3 according to the embodiment. FIG. 7 is a flowchart illustrating a process procedure of the elevation controller 4 of the vertical carrying controller 3 according the embodiment.

First, a process procedure of the turntable controller 7 will be described with reference to FIG. 6. As shown in FIG. 6, first, the turntable controller 7 determines whether the carrying operation request is output from the carrying system controller 2 every predetermined time interval. When the turntable controller receives the carrying operation instruction from the carrying system controller 2 (STEP S1: YES), the turntable controller determines whether the current position is the load receiving floor for receiving the load (STEP S2).

Then, when the current position is the floor for receiving the load (STEP S2: YES), the turntable controller does not transmit the elevation instruction to the elevation controller 4 and drives the driving motor 38 of the turntable 17 so that the turntable 17 turns to match with the carrying direction of the conveyor rail for receiving the load (STEP S3). On the other hand, when the current position is different from the floor for receiving the load (STEP S2: NO), the turntable controller transmits the elevation instruction to the elevation controller 4 so that the elevation conveyor is elevated up to the floor for receiving the load and drives the driving motor 38 of the turntable 17 so that the turntable 17 turns to match with the carrying direction of the conveyor rail for receiving the load (STEP S4).

Subsequently, when the turntable controller receives the elevation end signal output from the elevation controller 4 after the elevation conveyor arrives at the floor for receiving the load (STEP S5: YES), the turntable controller connects the paths of the roller conveyor 18 of the elevation conveyor 5 to the conveyor rail for receiving the load. In this state, the turntable controller transmits the drive instruction of the roller of the conveyor rail for receiving the load to the conveyor rail controller 6 on the floor provided with the conveyor rail for receiving the load and drives a driving motor 55 of the driving roller 47 of the elevation conveyor 5 so that the load receiving operation is completed by carrying the FOUP 8 from the conveyor rail for receiving the FOUP onto the elevation conveyor 5 (STEP S6). In addition, when both the pair of load detecting sensors 25 provided on the elevation conveyor 5 detects the FOUP, it is determined that the FOUP 8 is mounted to the normal position, and then the load receiving operation ends.

When the load receiving operation ends (STEP S6: YES), the turntable controller transmits the elevation instruction to the elevation controller 4 so that the elevation conveyor is elevated up to the floor for delivering the load and drives the driving motor 38 of the turntable 17 so that the turntable 17 turns to match with the carrying direction of the conveyor rail for delivering the load (STEP S7).

Subsequently, when the turntable controller receives the elevation end signal output from the elevation controller 4 after the elevation conveyor arrives at the floor for delivering the load (STEP S8: YES), the turntable controller connects the paths of the roller conveyor 18 of the elevation conveyor 5 to the conveyor rail for delivering the load. In this state, the turntable controller transmits the drive instruction of the roller of the conveyor rail for delivering the load to the conveyor rail controller 6 provided on the floor provided with the conveyor rail for delivering the load and drives the driving motor 55 of the driving roller 47 of the elevation conveyor 5 so that the load delivering operation is completed by carrying the FOUP 8 from the elevation conveyor 5 onto the conveyor rail for delivering the FOUP (STEP S9). In addition, when both the pair of load detecting sensors 25 provided on the elevation conveyor 5 does not detect the FOUP, it is determined that the FOUP 8 does not exist, and then the load delivering operation ends.

Next, a process procedure of the elevation controller 4 will be described with reference to FIG. 7. As shown in FIG. 7, first, the elevation controller 4 determines whether the elevation instruction is output from the turntable controller 7 every predetermined time interval. When the elevation controller receives the elevation instruction from the turntable controller 7 (STEP S21: YES), the elevation controller elevates the elevation conveyor 5 up to the instructed target floor (a floor to be provided with the conveyor rail for receiving the load or a floor to be provided with the conveyor rail for delivering the load) by reciprocating the cableveyor 20 in the vertical direction (STEP S22).

Then, when the elevation controller checks that the elevation conveyor arrives at the port on the target floor (a floor to be provided with the conveyor rail for receiving the load or a floor to be provided with the conveyor rail for delivering the load) (STEP S23: YES), the elevation controller transmits the elevation end signal to the turntable controller 7 (STEP S24), and then the elevation operation ends.

In this way, according to the vertical carrying apparatus 1 related to this embodiment, when the system controller 2 outputs the carrying operation request of the FOUP 8, the turntable 17 of the elevation conveyor 5 can allow a direction of the elevator unit, which moves between floors while placing the FOUP 8 thereon, to match with the carrying direction of the conveyor rail for receiving or delivering the load. The turntable 17 can allow the roller conveyor 18 to match with the carrying direction of the conveyor rail for receiving or delivering the load. Then, the cableveyor 20 can elevate the elevation conveyor 5 from the floor provided with the conveyor rail for receiving the load to the floor provided with the conveyor rail for delivering the load. Accordingly, it is possible to improve efficiency of a carrying operation between floors in a carrying system in which a plurality of floors are provided with conveyor rails of various carrying directions.

Particularly, in a production plant using a carrying system in which a plurality of floors are provided with production processes due to an increase in the number of production units and a size of a carrying system in accordance with an increase in a production scale and a size of the production plant, when the vertical carrying apparatus 1 is applied to a roller conveyor carrying-type carrying system in which loads needs to be efficiently carried between floors by a roller conveyor, it is possible to improve efficiency of a carrying operation between floors.

In addition, since the elevator unit can be realized with a simple configuration of the cableveyor 20 installed in the elevation space 9, it is possible to realize a vertical carrying operation between floors, that is, a vertical carrying operation between a plurality of floors in an easy manner in a conveyor carrying-type carrying system in which a plurality of floors are provided with carrying conveyors of various carrying directions.

Further, when the system controller 2 outputs the carrying operation instruction of the FOUP 8, the vertical carrying controller 3 can automatically control the turntable 17 of the elevation conveyor 5 so that the roller conveyor 18 of the elevation conveyor 5 matches with the carrying direction of the conveyor rail for receiving or delivering the load, and can control the cableveyor 20 so that the elevation conveyor 5 is elevated from the floor provided with the conveyor rail for receiving the load to the floor provided with the conveyor rail for delivering the load. Accordingly, it is possible to further improve efficiency of the carrying operation between floors in the carrying system in which a plurality of floors are provided with conveyor rails of various carrying directions.

As described above, while the preferred embodiment has been described, the invention is not limited thereto. Various modifications may be made without departing from the spirit and the scope of the invention. Further, while the effect and advantage of the configuration of the invention has been described in the preferred embodiment, the effect and advantage is an example, but the invention is not limited thereto. Furthermore, the specific examples illustrate the configuration of the invention, but the invention is not limited thereto.

Figure 9:
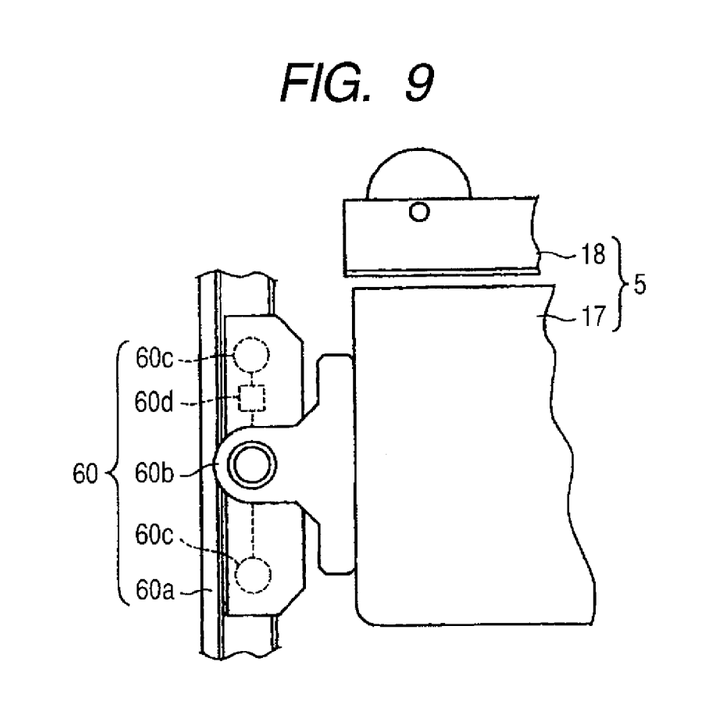
FIG. 9 is a front view which partly includes a sectional view and illustrates the cableveyor of the vertical carrying apparatus according to another embodiment.

For instance, in the preferred embodiments, the elevator unit is realized by the cableveyor 20 including the cable 20a installed in the elevation space 9 and the coupling member 20b coupled to the elevation conveyor 5 shown in FIG. 8, but the invention is not limited thereto. For instance, as shown in FIG. 9, the elevator unit may be configured as an elevator unit 60 including a rail (elevation path) 60a which is provided in the elevation space 9 in the vertical direction, and a motor 60d which is provided in a coupling member (holding member) 60b coupled to the elevation conveyor 5 so as to drive gears 60c and 60c, wherein the rail 60a engages with the gears 60c and the motor 60d drives the gears 60c so as to elevate the elevation conveyor 5 along the rail 60a in the vertical direction.

While there is shown a case where the vertical carrying apparatus according to the preferred embodiment is applied to the carrying system using the roller conveyor, the invention is not limited thereto. For instance, the vertical carrying apparatus according to the preferred embodiment may be applied to a carrying system using other carrying conveyors such as a belt conveyor and a chain conveyor or a carrying system using a carrying type such as an OHT or an OHS. Here, when the vertical carrying apparatus according to the preferred embodiment is applied to the carrying system using the carrying type such as the OHT or the OHS, the carrying operation may be carried out from the carrying path of the OHT or OHS to the respective ports 21 shown in FIG. 1 through OHT or OHS ports installed adjacent thereto. In addition, in case of the OHS, when a load receiver is configured as a conveyor, an object to be carried can be sent and received by the carrying operation between the OHT port and the conveyor.

This application claims the benefit of Japanese Patent Application No. 2005-362757 filed on Dec. 16, 2005, the entire contents of which are incorporated herein by reference.

INDUSTRIAL APPLICABILITY

As described above, according to the vertical carrying apparatus related to the invention, when a high-rank carrying system outputs a carrying operation instruction of an object to be carried, a rotation unit can allow a carrying conveyor to match with a carrying direction of a carrying path for receiving or delivering a load, and an elevator unit can elevate a carrying direction setting unit from a floor provided with the carrying path for receiving the load to a floor provided with the carrying path for delivering the load. Accordingly, it is possible to improve efficiency of a carrying operation between floors in a carrying system in which a plurality of floors are provided with carrying paths of various carrying directions.

The invention claimed is:

1. A vertical carrying apparatus which is connected to a plurality of remote extending carrying paths provided on a plurality of floors so as to vertically carry an object to be carried, the vertical carrying apparatus comprising:
   a carrying direction setting unit including a carrying conveyor which places the object carried from one of the carrying paths thereon and carries the object to one of the carrying paths and a rotation unit which turns the carrying conveyor so as to match with the carrying direction of the carrying path;
   an elevator unit which vertically elevates the carrying direction setting unit through a vertically oriented elevator shaft between the plurality of remotely extending carrying paths provided on the plurality of floors; and
   a vertical carrying control unit which controls the carrying direction setting unit and the elevator unit on the basis of a carrying operation instruction of the object.

2. The vertical carrying apparatus according to claim 1, wherein upon receiving the object, the vertical carrying control unit controls the elevator unit so that the carrying direction setting unit is elevated up to a floor provided with a carrying conveyor for receiving the object and controls the rotation unit so that the carrying conveyor matches with the carrying direction of the carrying conveyor for receiving the object, and
   wherein upon delivering the object, the vertical carrying control unit controls the elevator unit so that the carrying direction setting unit is elevated up to a floor provided with a carrying conveyor for delivering the object and controls the rotation unit so that the carrying conveyor matches with the carrying direction of the carrying conveyor for delivering the object.

3. The vertical carrying apparatus according to claim 1, wherein the elevator unit includes an elevation path which is vertically installed along the plurality of floors provided with the carrying paths and a hold member which holds the carrying direction setting unit in the elevation path, and
   wherein one of the elevation path and the hold member is driven so as to elevate the carrying direction setting unit.

4. The vertical carrying apparatus according to claim 1, wherein the carrying paths are provided in a production plant having a plurality of floors, and
   wherein the carrying paths and the carrying conveyor are configured as a roller conveyor.

* * * * *